(12) United States Patent
Ojha et al.

(10) Patent No.: US 11,255,920 B2
(45) Date of Patent: Feb. 22, 2022

(54) OPEN LOAD DETECTION CIRCUITS

(71) Applicant: TEXAS INSTRUMENTS INCORPORATED, Dallas, TX (US)

(72) Inventors: Ashish Ojha, Bengaluru (IN); Siddhartha Gopal Krishna, Bengaluru (IN); Divyasree J, Bengaluru (IN); Krishnamurthy Shankar, Bengaluru (IN); Venkata Naresh Kotikelapudi, Bengaluru (IN)

(73) Assignee: Texas Instruments Incorporated, Dallas, TX (US)

(\*) Notice: Subject to any disclaimer, the term of this patent is extended or adjusted under 35 U.S.C. 154(b) by 88 days.

(21) Appl. No.: 16/785,793

(22) Filed: Feb. 10, 2020

(65) Prior Publication Data

US 2021/0247462 A1 Aug. 12, 2021

(51) Int. Cl.
*G01R 31/52* (2020.01)
*H03K 17/687* (2006.01)

(52) U.S. Cl.
CPC ........... *G01R 31/52* (2020.01); *H03K 17/687* (2013.01)

(58) Field of Classification Search
None
See application file for complete search history.

(56) References Cited

U.S. PATENT DOCUMENTS

| | | | | |
|---|---|---|---|---|
| 5,438,286 A | * | 8/1995 | Pavlin | H03K 17/0824 327/50 |
| 2013/0082742 A1 | * | 4/2013 | Ren | H03K 17/30 327/81 |

\* cited by examiner

*Primary Examiner* — Jas A Sanghera
(74) *Attorney, Agent, or Firm* — John R. Pessetto; Charles A. Brill; Frank D. Cimino

(57) ABSTRACT

A circuit includes an input terminal, a first transistor, a second transistor, a comparator, a voltage reference circuit, and a control circuit. The first transistor includes a first terminal coupled to the input terminal. The second transistor includes a first terminal coupled to the input terminal. The comparator includes a first terminal coupled to the input terminal. The voltage reference circuit is coupled to a second terminal of the comparator. The control circuit includes an input, a first output, and a second output. The input is coupled to an output of the comparator. The first output is coupled to a second terminal of the first transistor. The second output is coupled to a second terminal of the second transistor.

14 Claims, 4 Drawing Sheets

OPEN LOAD DETECTION CIRCUITS

BACKGROUND

In electronic circuits that provide power to operate a load circuit, it is desirable to detect an open load condition (e.g., a condition in which no load circuit is connected to the electronic circuit). More generally, the open load condition is defined as a condition in which the output current of the electronic circuit is less than a predetermined minimum current. The predetermined minimum current may be much smaller than a typical load current.

SUMMARY

Apparatus and method for detecting an open load condition are disclosed herein. In a first example, a circuit includes an input terminal, a first transistor, a second transistor, a comparator, a voltage reference circuit, and a control circuit. The first transistor includes a first terminal coupled to the input terminal. The second transistor includes a first terminal coupled to the input terminal. The comparator includes a first terminal coupled to the input terminal. The voltage reference circuit is coupled to a second terminal of the comparator. The control circuit includes an input terminal, a first output terminal, and a second output terminal. The input terminal of the control circuit is coupled to an output terminal of the comparator. The first output terminal of the control circuit is coupled to a second terminal of the first transistor. The second output of the comparator is coupled to a second terminal of the second transistor.

In another example, a method includes turning on a transistor, and comparing a voltage across the transistor to a reference voltage while the transistor is turned on. The method also includes turning off the transistor, and comparing the voltage across the transistor to the reference voltage while the transistor is turned off. The method further includes setting an open load fault indicator responsive to the reference voltage being greater than the voltage across the transistor while the transistor is turned on and while the transistor is turned off.

In a further example, a motor drive circuit includes a high-side switch, a low-side switch, and an open load detection circuit. The low-side switch is coupled to the high-side switch, and includes a first transistor and a second transistor. The second transistor is connected in parallel with the first transistor. A resistance of the second transistor is greater than a resistance of the first transistor. The open load detection circuit is coupled to the low-side switch, and is configured to turn off the first transistor and turn on the second transistor based on a current flowing through the low-side switch being less than a predetermined current.

BRIEF DESCRIPTION OF THE DRAWINGS

For a detailed description of various examples, reference will now be made to the accompanying drawings in which.

DETAILED DESCRIPTION

In some electronic circuits, open load detection is performed by comparing the voltage across a switching transistor (e.g., the drain-source voltage of a field effect transistor (FET) to a reference voltage. A sense FET is provided to measure the current in the switching transistors in some circuits. If the voltage across the switching transistor is less than the reference voltage, then the load is deemed open. However, for very low load currents, the voltage across the switching transistor may be less than the reference voltage, in which case the load is deemed open in error. For example, if the switching transistor has ON resistance of 0.5 ohms, with 10 milliamperes (ma) of load current the voltage across the switching transistor is 5 millivolts (my), and with a 1 ma load current voltage across the switching transistor is 0.5 my. Variance in the reference voltage, switching transistor to sense FET mismatch, and comparator offsets make it difficult to accurately detect an open load condition with very low load currents. If the reference voltage is set to a very low value to accommodate open load detection with low load currents the offset of the comparator becomes a significant source of error.

The open load detection circuitry of the present disclosure implements a switch as a pair of transistors, where one of the transistors is larger (e.g., 10×) than the other, and has a lower resistance than (e.g., 1/10$^{th}$ of) the other. In metal oxide semiconductor field effect transistors (MOSFETs), the on resistance ($R_{ON}$) of the transistor is function of the width (W) and length (L) of the channel between the drain and the source. On resistance decreases with channel width $$\left(R_{ON} \propto \frac{1}{W}\right).$$

Thus, for a given channel length, a transistor with larger channel width (i.e., a larger transistor) has a lower on resistance. With the larger transistor turned on, the open load detection circuit compares the voltage across (or at an output of) the switching transistor to the reference voltage. If the voltage is less than the reference voltage, then the larger transistor is turned off. With the smaller transistor turned on, the open load detection circuit compares the voltage across (or at an output of) the switching transistor to the reference voltage. If the voltage is less than the reference voltage, then the load is deemed open, and if the voltage is not less than reference voltage, then no open load condition is present. Because of the relatively small currents flowing when the larger transistor is turned off, the increased voltage drop of the smaller transistor has little or no effect on the load circuit.

Figure 1:
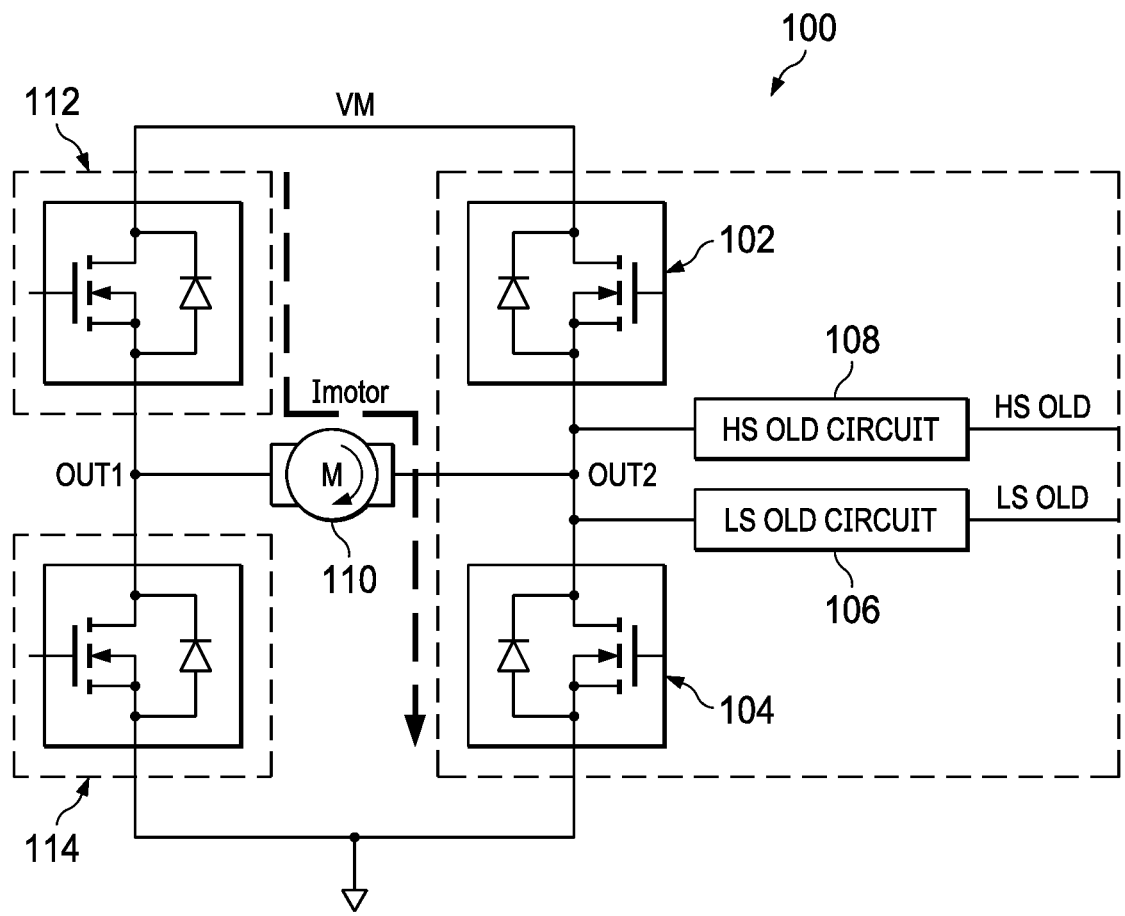
FIG. 1 shows an block diagram for an example bridge circuit that includes open load detection in accordance with this description.

FIG. 1 shows an example block diagram for a bridge circuit 100 that includes open load detection in accordance with this description. The bridge circuit 100 includes a high-side switch 102, a low-side switch 104, an open load detection circuit 106, and an open load detection circuit 108.

The high-side switch 102 is coupled to the low-side switch 104, the open load detection circuit 106, and the open load detection circuit 108. An electric motor 110 is shown as being driven by the bridge circuit 100, although other circuits and/or devices (such as light emitting diodes) are driven by the bridge circuit 100 in some implementations. The bridge circuit 100 also includes a high-side switch 112 and a low-side switch 114.

The direction of the electric motor 110 is controlled by the direction of current flow through the bridge circuit 100. The high-side switch 112 and the low-side switch 104 are closed to rotate the electric motor 110 in a first direction. The high-side switch 102 and the low-side switch 114 are closed to rotate the electric motor 110 in a second direction.

The open load detection circuit 106 detects an open load condition when the low-side switch 104 is closed. The open load detection circuit 108 detects an open load condition when the high-side switch 102 is closed. The high-side switch 102, the low-side switch 104, the open load detection circuit 106, and the open load detection circuit 108 distinguish small load currents from an open load condition to allow accurate identification of an open load condition when a load circuit draws small currents.

Figure 2:
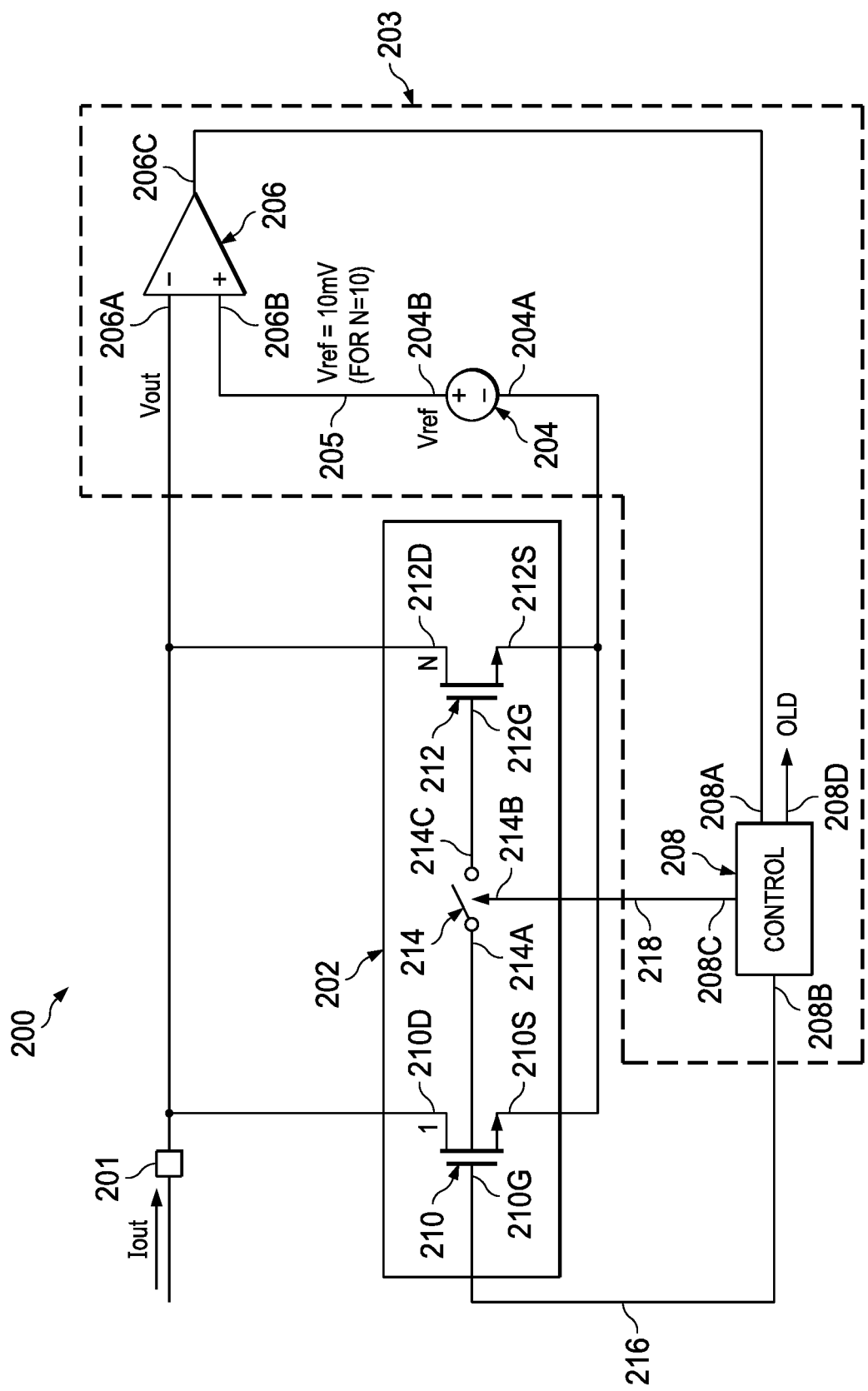
FIG. 2 shows an block diagram for an example circuit that provides open load detection in accordance with this description.

FIG. 2 shows an example block diagram for a circuit 200 that provides open load detection in accordance with this description. The circuit 200 is an implementation of the low-side switch 104 and the open load detection circuit 106. The circuit 200 includes an input terminal 201, a switch 202, and an open load detection circuit 203. The switch 202 includes a transistor 210 and a transistor 212 connected in parallel with the transistor 210. The transistor 212 is larger than the transistor 210, and has lower resistance (lower on drain-source resistance) than the transistor 210. The transistor 210 includes a drain terminal 210D coupled to the input terminal 201 and to a drain terminal 212D of the transistor 212. A source terminal 210S of the transistor 210 is coupled to a source terminal 212S of the transistor 212. The source terminal 210S and the source terminal 212S are coupled to ground in some implementations of the circuit 200. The switch 202 includes a switch 214 coupled to the gate terminal 210G of the transistor 210 and the gate terminal 212G of the transistor 212. The switch 214 includes a terminal 214A coupled to the gate terminal 210G of the transistor 210 and a terminal 214C coupled to the gate terminal 212G of the transistor 212.

The open load detection circuit 203 is coupled to the switch 202, and turns the transistor 210 and transistor 212 on or off as needed to identify an open load condition. When the transistor 210 and/or the transistor 212 is turned on, current flows from the input terminal 201 through the transistor 210 and/or the transistor 212. The open load detection circuit 203 includes a voltage reference circuit 204, a comparator 206, and a control circuit 208. The voltage reference circuit 204 includes a terminal 204A and a terminal 204B. The terminal 204A of the voltage reference circuit 204 is coupled to ground. The voltage reference circuit 204 generates a reference voltage 205. The comparator 206 includes an input terminal 206A, an input terminal 206B, and an output terminal 206C. The comparator 206 compares the reference voltage 205 and the voltage at the input terminal 201 (e.g., the voltage across the switch 202). The input terminal 206A of the comparator 206 is coupled to the input terminal 201, the drain terminal 210D, and the drain terminal 212D. The input terminal 206B of the comparator 206 is coupled to the terminal 204B of the voltage reference circuit 204. The voltage reference circuit 204 is implemented using a Zener diode or a bandgap circuit in some examples.

The control circuit 208 is coupled to the switch 202 and the comparator 206. The control circuit 208 turns the transistor 210 and the transistor 212 on or off based on the output of the comparator 206. For example, some implementations of the control circuit 208 include state machine circuitry controls the transistor 210 and the transistor based on the output of the comparator 206 as described in the method 300 of FIG. 3. The control circuit 208 includes an input terminal 208A coupled to the output terminal 206C of the comparator 206, an output terminal 208B coupled to the gate terminal 210G of the transistor 210 and the terminal 214A of the switch 214, an output terminal 208C coupled to the terminal 214B of the switch 214, and an output terminal 208D. A signal 216 provided at the output terminal 208B of the control circuit 208 turns the transistor 210 on or off, and turns the transistor 212 on or off if the switch 214 is closed. A signal 218 provided at the output terminal 208C of the control circuit 208 opens or closes the switch 214. Opening the switch 214 turns the transistor 212 off, and closing the switch 214 turns the transistor 212 on or off based on the signal 216. While the switch 214 is illustrated as coupled to and controlling the gate terminal 212G of the transistor 212, in some implementations of the circuit 200, the switch 214 is coupled to and controls the drain terminal 212D of the transistor 212 or the source terminal 212S of the transistor 212.

Figure 3:
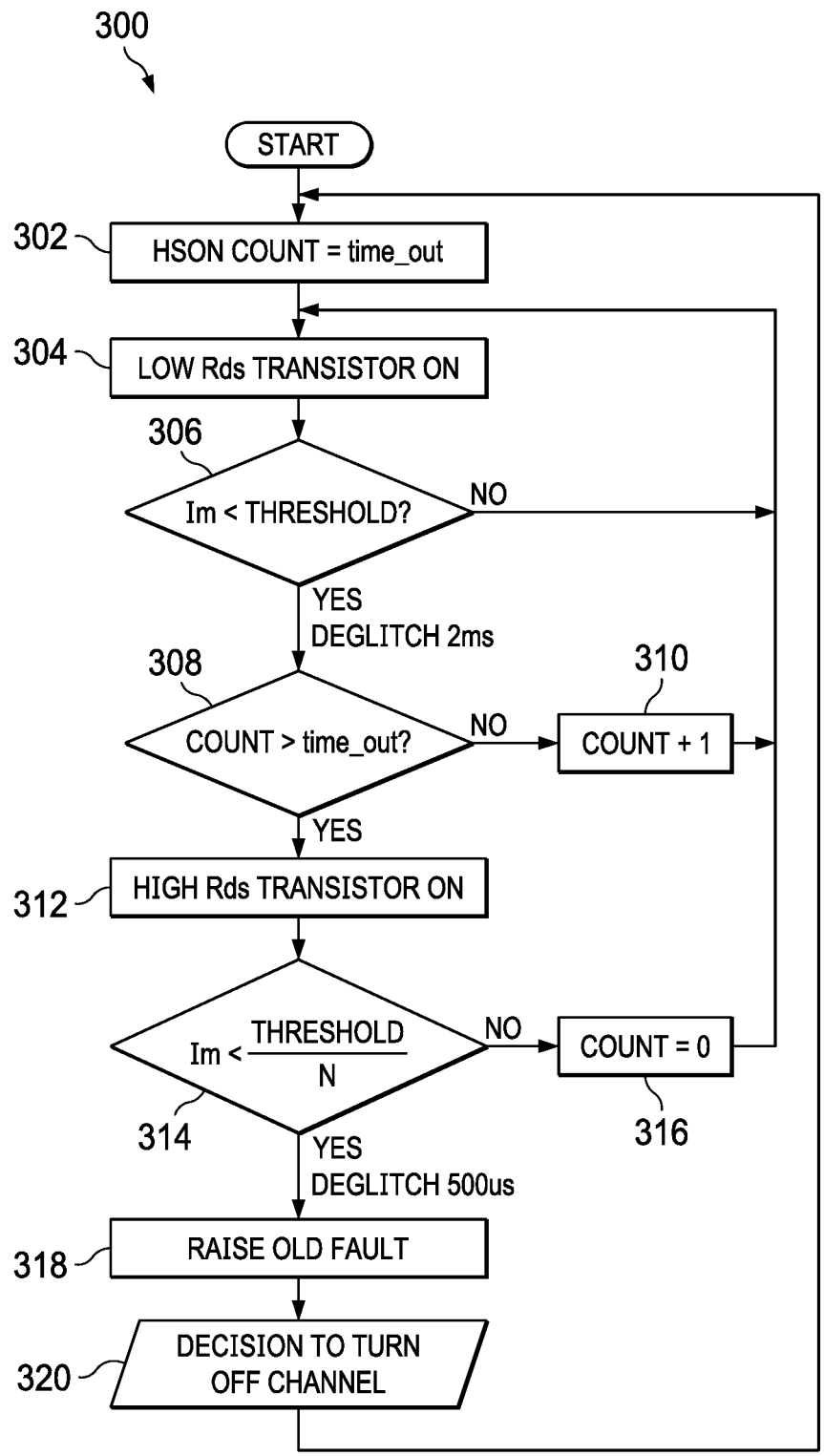
FIG. 3 shows a flow diagram for an example method for open load detection in accordance with this description.

FIG. 3 shows an example flow diagram for a method 300 for open load detection in accordance with this description. Though depicted sequentially as a matter of convenience, at least some of the actions shown can be performed in a different order and/or performed in parallel. Additionally, some implementations may perform only some of the actions shown. Operations of the method 300 are performed by implementations of the circuit 200.

In block 302, the control circuit 208 initializes for open load detection. The initialization includes initializing a counter (e.g., setting the counter to zero) in some implementations of the method 300.

In block 304, the control circuit 208 turns on the transistor 212. For example, the control circuit 208 activates the signal 216 and the signal 218. The signal 218 closes the switch 214 and the signal 216 turns on the transistor 210 and the transistor 212.

In block 306, the comparator 206 compares the voltage across the switch 202 with the transistor 212 turned on to the reference voltage 205. The reference voltage 205 defines an open load threshold. For example, with the transistor 212 turned on the reference voltage 205 may correspond to a threshold current of 20 ma. If the output of the comparator 206 indicates that the current flowing through the switch 202 is not less than the threshold current (e.g., the voltage across the switch 202 is greater than the reference voltage 205), then the method 300 continues in block 304.

If, in block 306, the output of the comparator 206 indicates that the current flowing through the switch 202 is less than a threshold current (i.e., the voltage across the switch 202 is less than the reference voltage 205), then in block 308, the control circuit 208 compares a counter value to a timeout value. Comparison of the counter value to the timeout value helps to suppress deactivation of the transistor 212 due to a transient. For example, the counter value may exceed the timeout value if the voltage across the switch 202 is less than the reference voltage 205 for a predetermined time, such as 2 milliseconds. If, in block 308, the counter value does not exceed the timeout value, then the counter value is incremented in block 310 and the method 300 continues in block 304. Repeating the operations of blocks 304-310 until the counter value exceeds the timeout value compares the voltage across the switch 202 to the reference voltage 205 a plurality of times, with the transistor 212 turned off if the voltage across the switch 202 is less than the reference voltage 205 each of the successive times the comparison is performed.

If in block 308, the counter value exceeds the timeout value and the output of the comparator 206 indicates that the current flowing through the switch 202 is less than a threshold current, then in block 312, the control circuit 208 turns off the transistor 212 and the transistor 210 is turned on or remains on. For example, the control circuit 208 deactivates the signal 218 to open the switch 214 and turn off the transistor 212. The signal 216 remains active and the transistor 210 remains on. Thus, the resistance through which current flows in the switch 202 is increased, which in turn increases the voltage drop across the switch 202.

In block 314, the comparator 206 compares the voltage across the switch 202, with the transistor 212 turned off and the transistor 210 turned on, to the reference voltage 205. With the transistor 212 turned off, the reference voltage 205 defines a lower open load threshold than in block 306. For example, with the transistor 212 turned off the reference voltage 205 may correspond to a threshold of 1/Nth the threshold of block 306, where N represents the size differential of the transistor 212 to the transistor 210. If the transistor 212 is 10 time larger than the transistor 210, and the reference voltage 205 defines a 20 ma threshold in block 306, then the reference voltage 205 represents a 2 ma threshold in block 314. If the output of the comparator 206 indicates that the current flowing through the switch 202 is not less than the threshold current (e.g., the voltage across the switch 202 is greater than the reference voltage 205), then an open load condition has not been detected and the method 300 continues in block 316.

In block 316, the control circuit 208 resets the counter value, and the method 300 continues in block 304.

If, in block 316, the output of the comparator 206 indicates that the current flowing through the switch 202 (with the transistor 212 off and the transistor 210 on) is less than a threshold current (i.e., the voltage across the switch 202 is less than the reference voltage 205), then in block 318, the control circuit 208 sets an open load fault indicator. For example, the control circuit 208 activates a signal at the output terminal 208D of the control circuit 208 in some implementations of the method 300. In some implementations of the method 300, the control circuit 208 applies a deglitching time (e.g., 500 microseconds) prior to setting the open load fault indicator in block 318.

In block 320, the control circuit 208, or circuitry coupled to the control circuit 208 determines whether the switch 202 should be opened (i.e., the transistor 210 and the transistor 212 turned off) responsive to the detected open load condition. For example, the control circuit 208 may deactivate the signal 216 responsive to detection of the open load condition.

Figure 4:
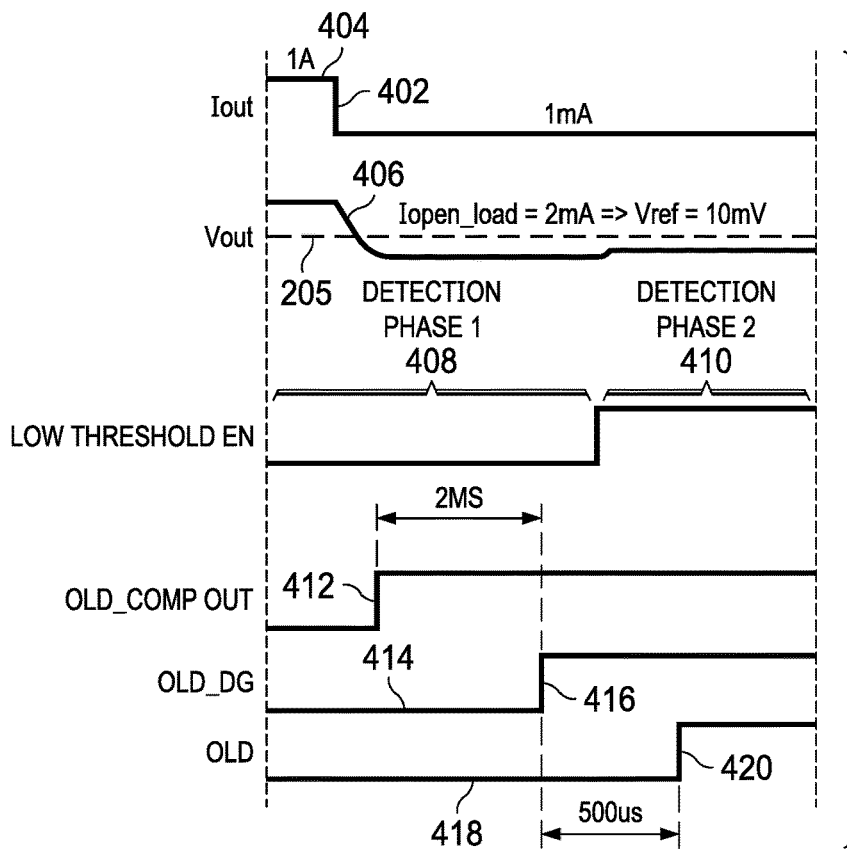
FIG. 4 shows an example timing diagram for open load detection for a load current below a reference threshold in accordance with this description.

FIG. 4 shows an example timing diagram for open load detection for a load current below a reference threshold in accordance with this description. At 402, the current 404 through the switch 202 decreases from 1 ampere (A) to 1 ma. As a result, the voltage 406 across the switch 202 falls below the reference voltage 205 and the output of the comparator 206 is activated at 412. After a transient suppression delay (e.g., 2 milliseconds), the control circuit 208 activates an open load detection signal 414 (an initial open load detection signal) at 416. The open load detection signal 414 corresponds to open load detection with the transistor 212 turned on in the interval 408.

Responsive to activation of the open load detection signal 414, the control circuit 208 turns off the transistor 212 to enable open load detection with the transistor 212 turned off in the interval 410. With the transistor 212 turned off, the voltage 406 increases, but remains below the reference voltage 205. After a transient suppression delay (e.g., 500 microseconds), the control circuit 208 activates the open load detection signal 418 at 420 to indicate than an open load condition has been detected. The open load detection signal 414 corresponds to open load detection with the transistor 212 turned off and the transistor 210 turned on in the interval 410.

Figure 5:
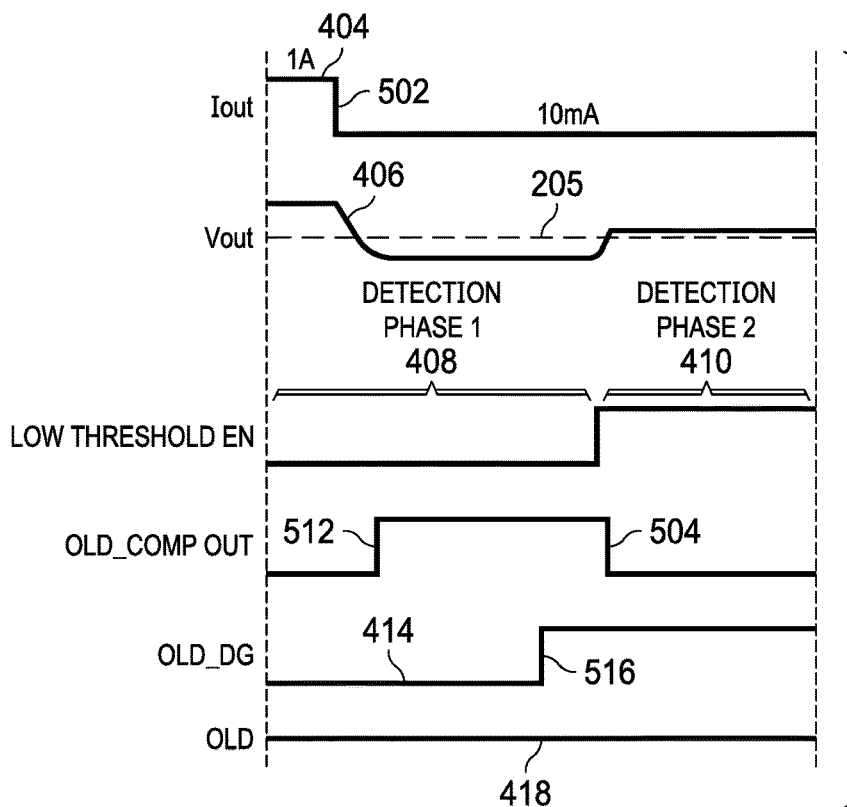
FIG. 5 shows an example timing diagram for open load detection for a load current above a reference threshold in accordance with this description.

FIG. 5 shows an example timing diagram for open load detection for a load current above a reference threshold in accordance with this description. At 402, the current 404 through the switch 202 decreases from 1 A to 10 ma. As a result, the voltage 406 across the switch 202 falls below the reference voltage 205 and the output of the comparator 206 is activated at 512. After a transient suppression delay, the control circuit 208 activates an open load detection signal 414 (an initial open load detection signal) at 516. The open load detection signal 414 corresponds to open load detection with the transistor 212 turned on in the interval 408.

Responsive to activation of the open load detection signal 414, the control circuit 208 turns off the transistor 212 to enable open load detection with the transistor 212 turned off in the interval 410. With the transistor 212 turned off, the voltage 406 increases to exceed the reference voltage 205. Because the voltage 406 exceeds the reference voltage 205, the output of the comparator 206 is deactivated at 504, and the open load detection signal 418 remains inactive to indicate that no open load condition has been detected. Thus, the open load detection apparatus and method disclosed herein distinguish small load currents from an open load condition.

Figure 6:
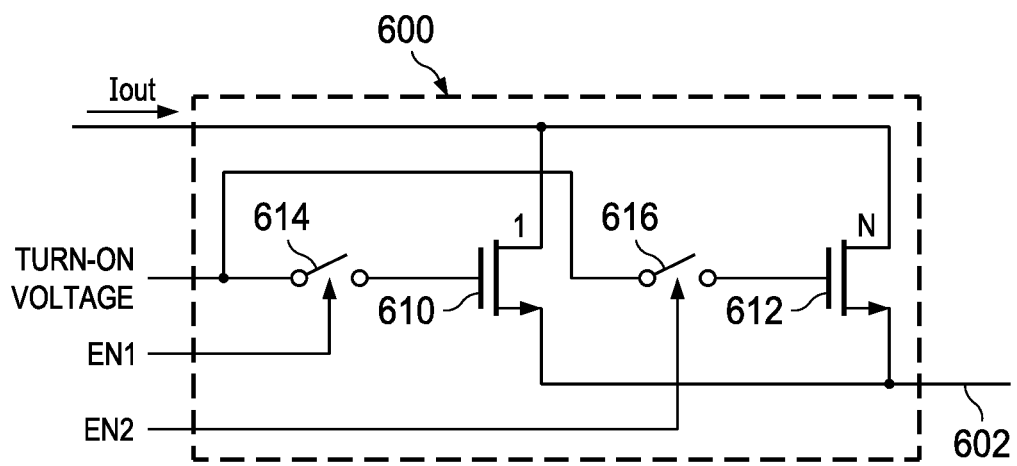
FIG. 6 shows a schematic diagram for an example high-side switch in accordance with this description.

FIG. 6 shows a schematic diagram for an example high-side switch 600 in accordance with this description. The high-side switch 600 is an implementation of the high-side switch 102, and is coupled to the open load detection circuit 108 (an implementation of the open load detection circuit 203) for open load detection. The high-side switch 600 includes a transistor 610 (high-resistance transistor), a transistor 612 (low-resistance transistor), a switch 614, and a switch 616. The transistor 610 is connected in parallel with the transistor 612. The transistor 610 is smaller, and has a higher resistance, than the transistor 612. The switch 614 switches a turn-on voltage to the transistor 610, and the switch 616 switches the turn-on voltage to the transistor 612. The switch 614 is controlled by an enable signal, such as the signal 216, generated by the control circuit 208. The switch 616 is controlled by an enable signal, such as the signal 218, generated by the control circuit 208. Application of the high-side switch 600 is similar to that described for the switch 202. The control circuit 208 turns on the transistor 612, by closing the switch 616, to provide a low resistance path through the high-side switch 600, and the control circuit 208 turns off the transistor 612, by opening the switch 616, and turns on the transistor 610, by closing the switch 614, to provide a higher resistance path through the high-side switch 600 when the control circuit 208 indicates a possible open load condition with the transistor 612 turned on.

Modifications are possible in the described embodiments, and other embodiments are possible, within the scope of the claims.

What is claimed is:

1. A circuit comprising:
   an input terminal;
   a first transistor comprising a first terminal coupled to the input terminal;
   a second transistor comprising a first terminal coupled to the input terminal;
   a comparator comprising a first terminal coupled to the input terminal;
   a voltage reference circuit coupled to a second terminal of the comparator;
   a control circuit comprising:
      an input coupled to an output of the comparator;
      a first output coupled to a second terminal of the first transistor; and
      a second output coupled to a second terminal of the second transistor.

2. The circuit of claim 1, wherein a drain-source resistance of the first transistor is smaller than a drain-source resistance of the second transistor.

3. The circuit of claim 1, wherein:
   the voltage reference circuit is configured to generate a reference voltage; and
   the comparator is configured to compare the reference voltage to a voltage at the input terminal.

4. The circuit of claim 3, wherein the control circuit is configured to turn off the first transistor responsive to the voltage at the input terminal being less than the reference voltage.

5. The circuit of claim 4, wherein the control circuit is configured to turn off the first transistor responsive to the voltage at the input terminal being less than the reference voltage for a predetermined time.

6. The circuit of claim 4, wherein the control circuit is configured to:
   turn on the second transistor while the first transistor is turned off, and
   turn on the first transistor responsive to the voltage at the input terminal being greater than the reference voltage with the first transistor turned off and the second transistor turned on.

7. The circuit of claim 4, wherein the control circuit is configured to set an open load fault indicator responsive to the voltage at the input terminal being less than the reference voltage with the first transistor turned off and the second transistor turned on.

8. The circuit of claim 1, further comprising:
   a switch comprising:
      a first terminal coupled to the second terminal of the first transistor;
      a second terminal coupled to the second terminal of the second transistor; and
      a third terminal coupled to the first output of the control circuit.

9. A method, comprising:
   turning on a transistor;
   comparing a voltage across the transistor to a reference voltage while the transistor is turned on;
   turning off the transistor;
   comparing the voltage across the transistor to the reference voltage while the transistor is turned off; and
   setting an open load fault indicator responsive to the reference voltage being greater than the voltage across the transistor while the transistor is turned on and while the transistor is turned off;

further comprising:
   comparing the voltage across the transistor to the reference voltage while the transistor is turned on a plurality of times; and
   turning off the transistor responsive to the voltage across the transistor being less than the reference voltage each of the plurality of times.

10. The method of claim 9, wherein:
    the transistor is a first transistor;
    a second transistor is connected in parallel with the first transistor; and
    the method further comprises turning on the second transistor while the first transistor is turned off.

11. The method of claim 10, wherein a resistance of the second transistor is greater than a resistance of the first transistor.

12. The method of claim 10, further comprising opening a switch disposed between a terminal of the first transistor and a terminal of the second transistor responsive to the reference voltage being greater than the voltage across the first transistor while the first transistor is turned on.

13. A motor drive circuit, comprising:
    a high-side switch;
    a low-side switch coupled to the high-side switch, and comprising:
       a first transistor; and
       a second transistor connected in parallel with the first transistor, wherein a resistance of the second transistor is greater than a resistance of the first transistor; and
    an open load detection circuit coupled to the low-side switch, and configured to turn off the first transistor and turn on the second transistor based on a current flowing through the low-side switch being less than a predetermined current;
    wherein:
       the open load detection circuit is a first open load detection circuit;
       the high-side switch comprises:
          a low-resistance transistor; and
          a high-resistance transistor connected in parallel with the low-resistance transistor, wherein a resistance of the high-resistance transistor is greater than a resistance of the low-resistance transistor; and
       the motor drive circuit further comprises:
          a second open load detection circuit comprising:
             a comparator configured to compare a voltage at an output of the high-side switch to a reference voltage; and
             a control circuit coupled to the comparator and the high-side switch, and configured to turn off the low-resistance transistor responsive to the comparator indicating that voltage at the output of the high-side switch is less than the reference voltage.

14. The motor drive circuit of claim 13, wherein the second open load detection circuit is configured to:
    set an open load fault indicator responsive to the reference voltage being greater than the voltage at the output of the high-side switch while the low-resistance transistor is turned off and the high-resistance transistor is turned on; and
    turn on the low-resistance transistor responsive to the voltage at the output of the high-side switch being greater than the reference voltage while the first transistor is turned off and the second transistor is turned on.

* * * * *